United States Patent
Wu

(10) Patent No.: US 6,612,853 B2
(45) Date of Patent: Sep. 2, 2003

(54) EXTENSIBLE/RETRACTABLE AND STORABLE PORTABLE MEMORY DEVICE

(75) Inventor: Kuei-Tung Wu, Taipei (TW)

(73) Assignee: Speed Tech Corp., Taoyuan County (TW)

( * ) Notice: Subject to any disclaimer, the term of this patent is extended or adjusted under 35 U.S.C. 154(b) by 62 days.

(21) Appl. No.: 10/001,830

(22) Filed: Dec. 5, 2001

(65) Prior Publication Data

US 2003/0103369 A1 Jun. 5, 2003

(51) Int. Cl.[7] .............................................. H01R 13/44
(52) U.S. Cl. ...................................... 439/136; 439/141
(58) Field of Search .............................. 439/131, 136, 439/140, 141; 361/725, 732, 740, 747, 801

(56) References Cited

U.S. PATENT DOCUMENTS

| | | | | |
|---|---|---|---|---|
| 5,030,119 A | * | 7/1991 | Lowe | ......................... 439/141 |
| 5,797,771 A | * | 8/1998 | Garside | ....................... 439/610 |
| 5,920,459 A | * | 7/1999 | Weber et al. | ................ 361/752 |
| 6,449,164 B1 | * | 9/2002 | Gershfeld | ..................... 361/752 |
| 6,522,534 B1 | * | 2/2003 | Wu | .............................. 361/686 |

* cited by examiner

Primary Examiner—Neil Abrams
Assistant Examiner—Thanh-Tam Le
(74) Attorney, Agent, or Firm—Troxell Law Office PLLC

(57) ABSTRACT

Extensible/retractable and storable portable memory device including a main body and a sheath. The main body has an adapter at one end. One end of the sheath is formed with an opening for fitting the adapter end of the main body. The other end of the sheath is formed with a through hole through which the adapter can outward protrude. Two sides of the sheath are formed with inward projecting stop boards. The middle portions of two sides of the main body are respectively formed with two lateral projecting blocks. The stop boards stop the lateral projecting blocks from outward sliding so that the main body is restricted to relatively slide within the sheath to extend the adapter out of the sheath or retract the adapter therein and locate the adapter in a predetermined position. Therefore, the memory device can be easily used and carried.

7 Claims, 5 Drawing Sheets

EXTENSIBLE/RETRACTABLE AND STORABLE PORTABLE MEMORY DEVICE

BACKGROUND OF THE INVENTION

The present invention is related to an extensible/retractable and storable portable memory device, and more particularly to a portable memory device which has small volume and can be conveniently used. The memory device can be easily carried with good protection.

The existent portable memory device of an electric appliances or a computer is used to process or store data. Such portable memory device is required to have small volume and be easily usable and portable. For example, the currently widely used flash RAM module which can be connected with a personal computer or notebook-type computer via a universal serial bus (USB) has small volume and can be easily carried.

However, when carried, the above memory device is generally placed in a pocket or a bag. In action, the protruding elements of the memory device (especially the USB connector) is very likely to be damaged due to collision or abnormal squeezing of alien article. Therefore, a sheath is used to cover and protect the protruding elements from being damaged. In use, the sheath must be taken off and is easy to miss.

SUMMARY OF THE INVENTION

It is therefore a primary object of the present invention to provide an extensible/retractable and storable portable memory device including a main body and a sheath. The main body has an adapter at one end. One end of the sheath is formed with an opening for fitting the adapter end of the main body. The other end of the sheath is formed with a through hole through which the adapter can outward protrude. The main body can be slided relative to the sheath. The sheath and the main body are formed with corresponding stop boards and lateral projecting blocks, whereby the main body is slidable within the sheath to extend the adapter out of the sheath or retract the adapter therein and locate the adapter in a predetermined position. Therefore, the memory device can be easily used and carried.

The present invention can be best understood through the following description and accompanying drawings wherein:

DETAILED DESCRIPTION OF THE PREFERRED EMBODIMENT

Figure 1:
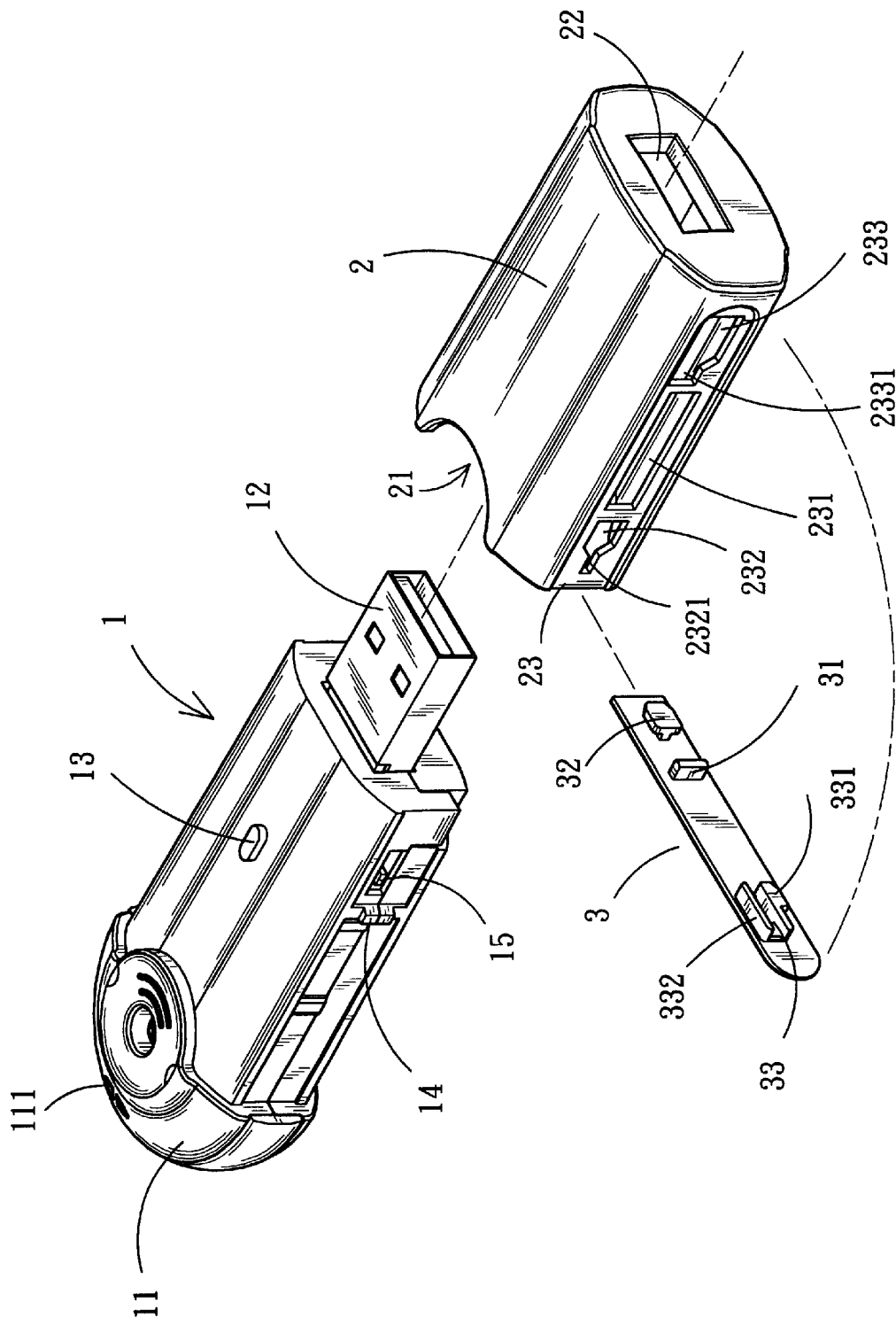
FIG. 1 is a perspective exploded view of the present invention.
Figure 2:
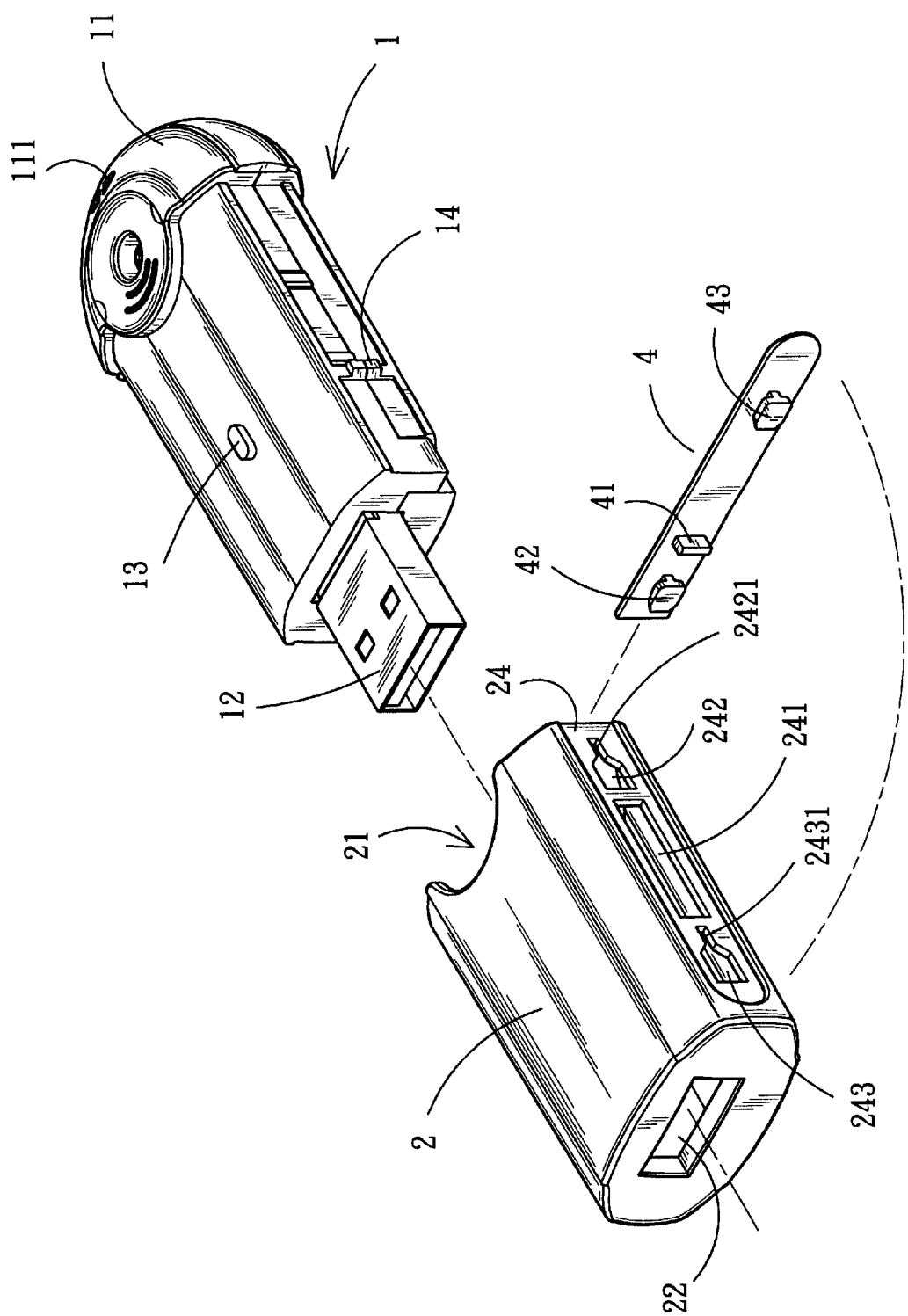
FIG. 2 is a perspective exploded view of the present invention seen from the other side.
Figure 3:
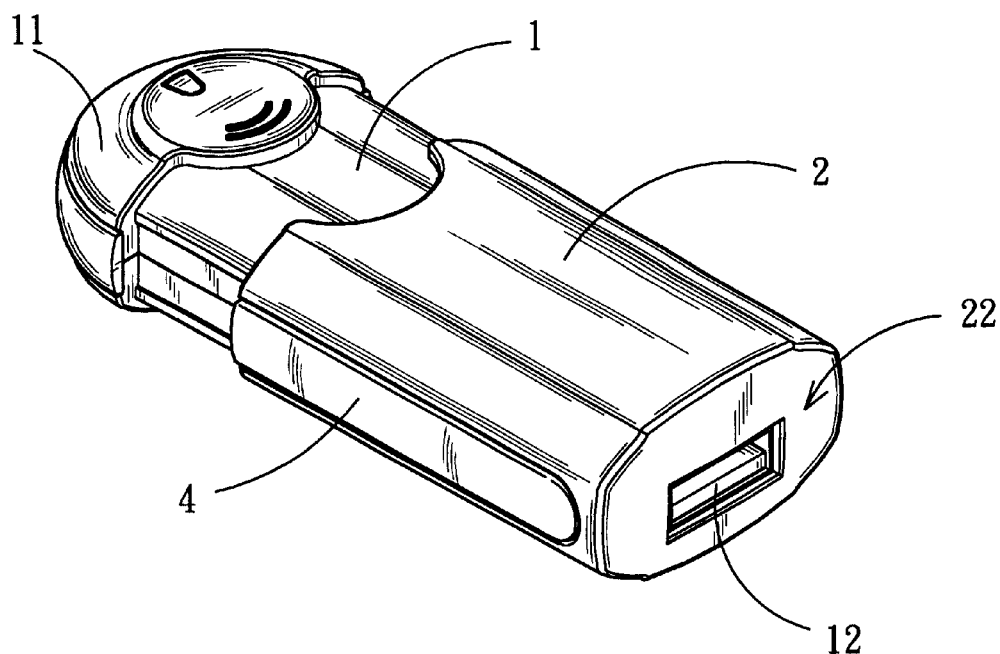
FIG. 3 shows that the adapter of the present invention is retracted into the sheath of the present invention.
Figure 4:
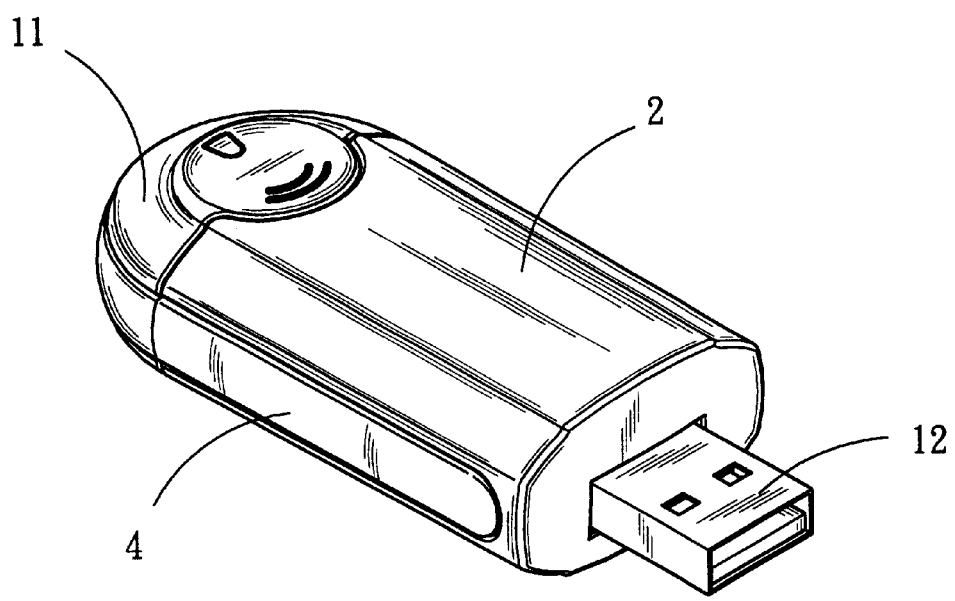
FIG. 4 shows that the adapter of the present invention is extended out of the sheath of the present invention when used.
Figure 5:
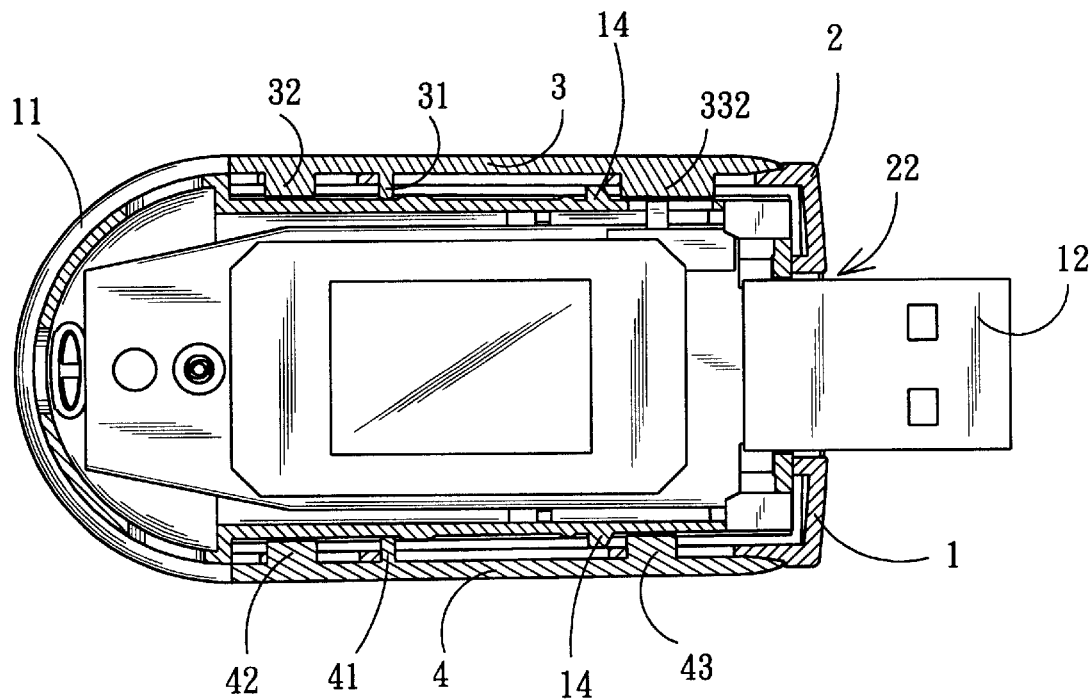
FIG. 5 is a top sectional view of the present invention, showing that the adapter is retracted.
Figure 6:
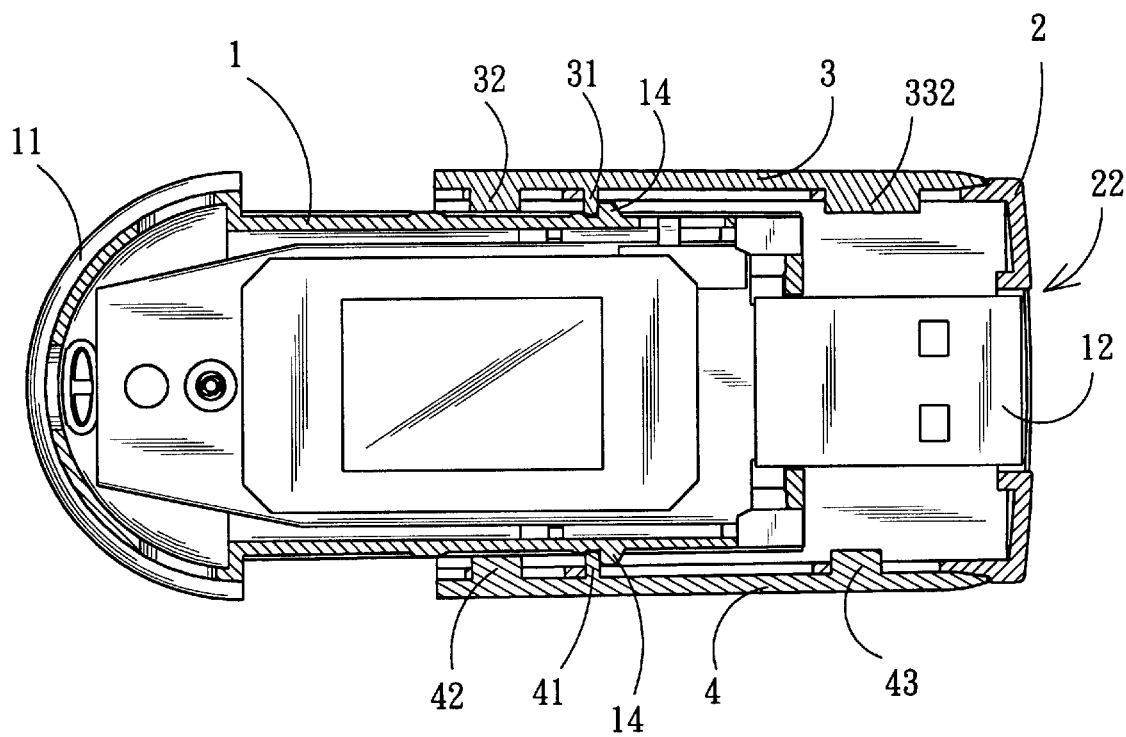
FIG. 6 is a top sectional view of the present invention, showing that the adapter is extended.
Figure 7:
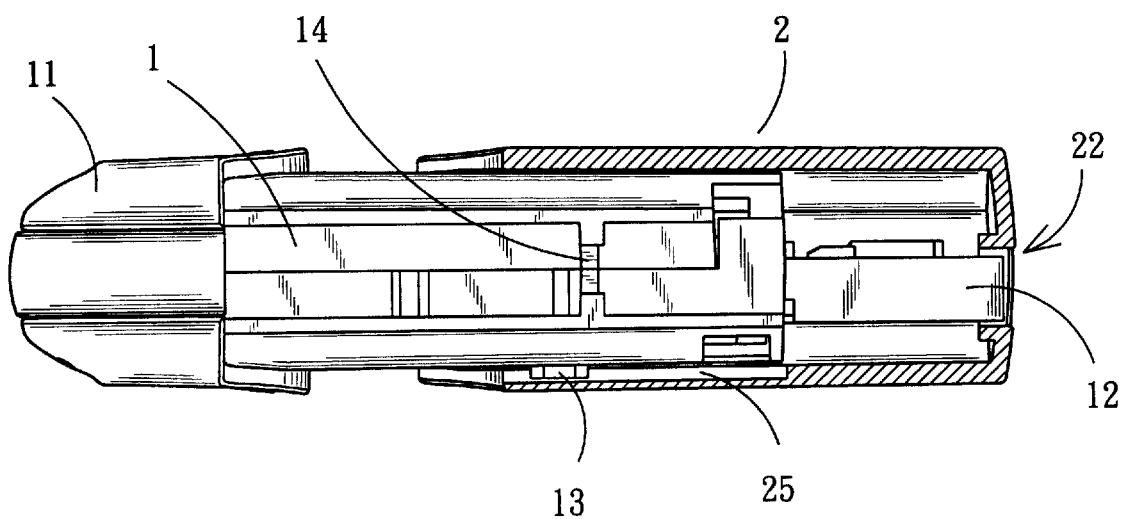
FIG. 7 is a side sectional view of the present invention, showing that the adapter is retracted.
Figure 8:
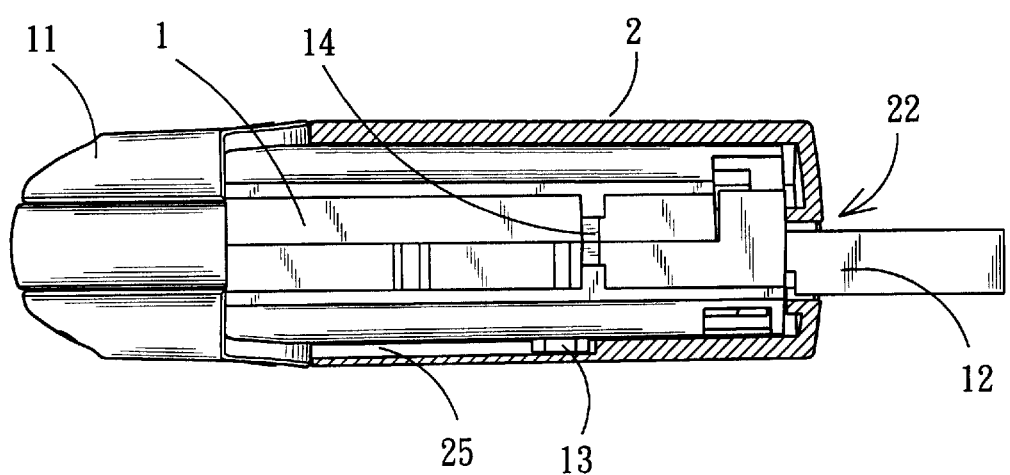
FIG. 8 is a side sectional view of the present invention, showing that the adapter is extended.

Please refer to FIGS. 1 and 2. The present invention includes a memory device main body 1, a sheath 2 and two lateral decorative covers 3, 4. One end of the main body 1 is formed with an outward expanded projecting stop section 11. The other end has an extending adapter 12 (which can be a USB interface). At least one hook hole 111 is formed on the periphery of the stop section 11 for a string or a key ring to pass therethrough and tied. Two lateral projecting blocks 14 are respectively formed on the middle portions of two sides of the main body 1. At least one projecting block 13 disposed on the top (or bottom) side of the main body 1. A shift switch 15 is disposed on one side of the main body 1 beside one of the lateral projecting blocks 14 for controlling the execution of writing of the memory unit in the main body 1. One end of the sheath 2 is formed with an opening 21 for fitting the adapter end of the main body 1 into the sheath 2 from the opening 21. The other end of the sheath 2 is formed with a through hole 22 through which the adapter 12 outward protrudes. Two outer sides of the sheath 2 are respectively formed with two lateral slide channels 23, 24 extending from the open end to the other end of the sheath 2. The middle portions of the lateral slide channels 23, 24 are respectively formed with lateral openings 231, 241. Two ends of the lateral openings 231, 241 are respectively formed with enlarged openings 232, 233, 242, 243. One side of each enlarged opening 232, 233, 242, 243 is formed with a guide slot 2321, 2331, 2421, 2431 extending to the opening 21. When the sheath 2 is entirely fitted onto the main body 1, a lateral side of the enlarged opening 233 (and the guide slot 2331) corresponding to the shift switch 15 is straight. The inner side of the sheath 2 is formed with a guide channel 25 inward extending from the opening 21 corresponding to the projecting block 13 of the main body 1. The lateral decorative cover 3 is mated with one side of the sheath 2 to cover the lateral slide channel 23. Two ends of the lateral decorative cover 3 are respectively formed with hook board 32 with a T-shaped cross-section and a slot 33. One side of the slot 33 is formed with a partitioning board 332 corresponding the straight lateral side of the enlarged opening 233 of the sheath 2. The other side is formed with a one-side hook board 331. The middle portion of the lateral decorative cover 3 is formed with a stop board 31 between the hook board 32 and the slot 33. The lateral decorative cover 4 is mated with the other side of the sheath 2 to cover the lateral slide channel 24. Two ends of the lateral decorative cover 4 are respectively formed with two hook boards 42, 43 with T-shaped cross-section. The middle portion of the lateral decorative cover 4 is formed with a stop board 41 between the hook boards 42, 43.

Please refer to FIGS. 3 to 8. When assembled, the adapter end of the main body 1 is first fitted into the sheath 2 from the opening 21 thereof (with the projecting block 13 inlaid in the guide channel 25 for guiding). The adapter 12 outward protrudes from the through hole 22. Then, the lateral decorative covers 3, 4 are respectively used to cover the lateral slide channels 23, 24. The hook boards 32, 42, 43 are respectively fitted into the enlarged openings 232, 242, 243 and slided and inserted into the guide slots 2321, 2421, 2431. Also, the partitioning board 332 and one-side hook board 331 of the lateral decorative cover 3 are fitted into the enlarged opening 233 of the sheath 2 and slided into the guide slot 2331. The one-side hook board 331 is hooked on one side of the guide slot 2331, whereby the lateral decorative covers 3, 4 are respectively located on the lateral slide channels 23, 24 of two sides of the sheath 2. At this time, the stop board 31 of the lateral decorative cover 3 and the stop board 41 of the lateral decorative cover 4 protrude from the lateral openings 231, 241 into the sheath 2.

In use, the stop board 31 of the lateral decorative cover 3 and the stop board 41 of the lateral decorative cover 4 right protrude between the lateral projecting blocks 14 of the main body 1 and the opening 21 of the sheath 2 to form an obstruction. At this time, a user can hold the projecting stop section 11 with one hand to push/pull the sheath 2, whereby the main body 1 can be slided relative to the sheath 2. Accordingly, the adapter 12 can be outward protruded from the through hole 22 or retracted thereinto. The stop boards 31, 41 serve to stop the lateral projecting blocks 14 to prevent the main body 1 from being over-slided and drawn out of the sheath 2.

The above embodiment is only used to illustrate the present invention, not intended to limit the scope thereof. Many modifications of the above embodiment can be made without departing from the spirit of the present invention.

What is claimed is:

1. Extensible/retractable and storable portable memory device comprising:
   a memory device main body, one end of the main body having a protruding adapter, two lateral projecting blocks being respectively formed on middle portions of two sides of the main body; and
   a sheath, one end of the sheath being formed with an opening for fitting the main body into the sheath from the opening, the other end of the sheath being formed with a through hole through which the adapter of the main body outward protrudes, two inward protruding stop boards being provided on middle portions of two inner lateral sides of the sheath, whereby the stop boards stop the lateral projecting blocks of the main body from outward slipping and keep the main body reciprocally slidable within the sheath and the adapter can be outward protruded from the through hole of the sheath or retracted thereinto.

2. Extensible/retractable and storable portable memory device as claimed in claim 1, wherein the stop boards extending into the sheath are formed on middle portions of two lateral decorative covers, two sides of the sheath being formed with two lateral openings corresponding to the lateral decorative covers, whereby when the lateral decorative covers are connected with the sheath, the stop boards of the lateral decorative covers right extend into the sheath.

3. Extensible/retractable and storable portable memory device as claimed in claim 2, wherein two ends of at least one lateral decorative cover are respectively formed with two hook boards with T-shaped cross-section, two sides of the sheath being formed with enlarged openings corresponding to the hook boards, a guide slot extending from one side of each enlarged opening, whereby the hook board can be fitted into the enlarged opening and slided along the guide slot to hook on inner side of the guide slot so as to firmly connect the lateral decorative covers on two sides of the sheath.

4. Extensible/retractable and storable portable memory device as claimed in claim 3, wherein one end of one lateral decorative cover is formed with a slot along sliding direction of the main body, one side of the slot being formed with a partitioning board, the other side of the slot being formed with a one-side hook board, one side of the sheath being formed with an enlarged opening, a guide slot extending from one side of the enlarged opening, whereby the partitioning board and the one-side hook board extend into the enlarged opening and slide along the guide slot, the one-side hook board being hooked on inner side of the guide slot to firmly connect the lateral decorative cover on one side of the sheath, the slot serving as a space communicating with the interior of the sheath.

5. Extensible/retractable and storable portable memory device as claimed in claim 1, wherein at least one projecting block is disposed on the middle of the main body, inner side of the sheath being formed with a guide channel corresponding to the projecting block, whereby the projecting block is inlaid in the guide channel to guide the main body to slide within the sheath.

6. Extensible/retractable and storable portable memory device as claimed in claim 1, wherein at least one hook hole is formed on one end of the main body exposed to outer side of the sheath for a string or a key ring to pass therethrough and tied.

7. Extensible/retractable and storable portable memory device as claimed in claim 1, wherein the adapter is a USB plug.

* * * * *